United States Patent [19]

Sibley

[11] 3,958,782
[45] May 25, 1976

[54] SHUNT ENHANCEMENT LOGIC CIRCUIT

[75] Inventor: Henry C. Sibley, Adams Basin, N.Y.

[73] Assignee: General Signal Corporation, Rochester, N.Y.

[22] Filed: Feb. 6, 1975

[21] Appl. No.: 547,677

[52] U.S. Cl. .............................. 246/40; 246/34 R; 246/128
[51] Int. Cl.² ....................................... B61L 21/06
[58] Field of Search ............... 246/34 R, 34 CT, 40, 246/77, 128, 130, 122 R; 307/265, 267; 328/58, 120

[56] References Cited
UNITED STATES PATENTS

| | | | |
|---|---|---|---|
| 3,011,050 | 11/1961 | Staples | 246/34 R |
| 3,683,176 | 8/1972 | Crofts | 246/40 |
| 3,819,933 | 6/1974 | Grundy | 246/40 |

*Primary Examiner*—Trygve M. Blix
*Assistant Examiner*—Reinhard J. Eisenzopf
*Attorney, Agent, or Firm*—Milton E. Kleinman; John Ohlandt

[57] ABSTRACT

A signaling circuit adapted to be used with railroad tracks or the like for ensuring fail-safe performance in respect to the operation of a control device, such as a track relay, which must function in a fail-safe manner, typically to become deenergized after a set period and to release or drop away when any emergency or failure occurs; thereby to produce a safe action, such as providing a warning signal to the engineer or operator of a train. The signaling circuit includes a quick-acting shunt detector which operates to detect short-duration shunting effects and functions to so extend or enhance them that they produce the desired result of releasing the track relay.

9 Claims, 2 Drawing Figures

SHUNT ENHANCEMENT LOGIC CIRCUIT

BACKGROUND, OBJECTS AND SUMMARY OF THE INVENTION

The present invention relates to signaling circuits adapted to be used in connection with railroad tracks and, more particularly, to a carrier frequency, shunt type of track circuit.

Carrier frequency signaling systems have been employed for many years on railroad lines and such systems provide advantageous operation inasmuch as a large number of signaling channels can be accommodated over the same transmission path. Such systems involve track circuits which are designed so that they rely on a shunting effect between the rails through the body or frame members of a railroad train. Thus, when there is no train present in a particular block, there is no shunting effect present and normal transmission takes place over the circuit between a transmitter and a suitable receiver or receivers. However, as soon as the train enters the particular block the aforesaid shunting takes place with the result that the receiver no longer provides its normal output signal, thereby actuating an appropriate warning device or providing over "safe" action.

Although the aforesaid systems have been known to function well under conditions of moderate or heavy traffic on a railroad line, it has been observed that track circuits on light traffic lines do not always shunt reliably because an insulating film tends to develop on the rails during the long time gaps encountered between the passage of successive trains. It has further been observed that when a moving train fails to cause the track relay to release continuously, that same train when stopped does shunt the track circuit completely. From these observations it may be inferred that a moving train shunts just as well as one that is stopped, but not one hundred per cent of the time.

The foregoing hypothesis has been tested on several occasions and the problem or difficulty encountered has been overcome by means of a principal feature of the present invention.

Accordingly, it is a primary object of the present invention to ensure great reliability in the operation of a carrier frequency, shunt type signaling system on a lightly traveled railroad line.

Another object is to overcome the difficulty that occurs on a lightly traveled line when, because of the presence of an insulating film, a moving train tends not to produce a sufficiently long shunting effect on a continuous basis but rather only on an intermittant basis.

Another object is to accomplish the foregoing in a failsafe manner.

In fulfillment of the above stated objects, the present invention provides the feature of a quick-acting shunt detector which is incorporated within a more or less standard track circuit receiver. This quick-acting shunt detector functions so as to interrupt the receiver output long enough to release the vital track relay and to produce the appropriate warning effects even though the shunt is of extremely short duration, i.e., of the order of 15 milliseconds. Without the presence of the quick acting shunt detector, the conventional receiver might ignore the occurrence of one or more short duration shunts as these occur. The reason for this is that it takes 300 milliseconds of shunting in the normal case to cause the vital relay to release.

Effectively then, the shunt detector of the present invention acts by reason of its internal logic to detect a shunt as short as 15 milliseconds and enhance or stretch it to a predetermined time period. This predetermined time period has been selected from several considerations to be of the order of 2.5 seconds. Accordingly, any time there appears short duration shunting of the track system within a 2.5 second period, the vital relay is kept in the released state, that is, the relay remains down so as to keep an emergency device activated.

Other and further objects, advantages and features of the present invention will be understood by reference to the following specification in conjunction with the annexed drawing, wherein like parts have been given like numbers.

DESCRIPTION OF PREFERRED EMBODIMENT

Figure 1:
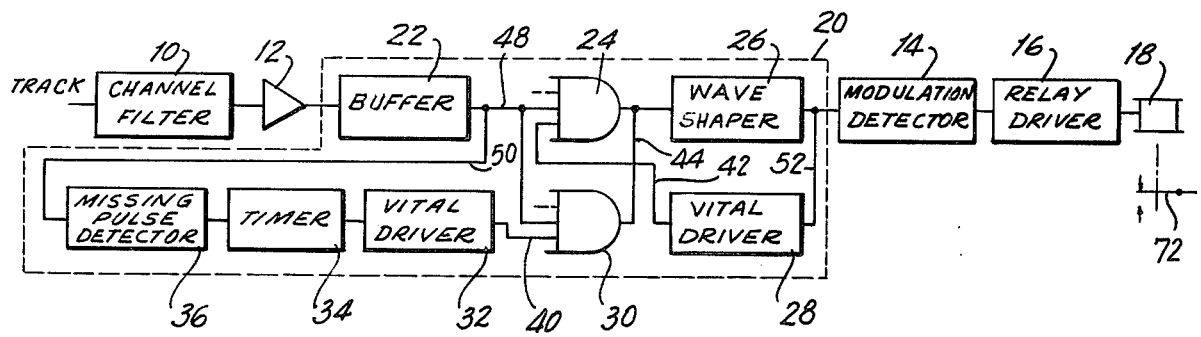
FIG. 1 is a block diagram of a preferred embodiment of the system of the present invention which incorporates a shunt enhancement logic circuit or means.

Referring now to the drawing and, in particular, for the moment to FIG. 1, there will be seen a block diagram illustrating a preferred embodiment of the present invention in which the shunt enhancement logic scheme or means is shown incorporated in a standard carrier frequency receiver. Thus, the more or less standard parts are shown in block form: at one end of the standard system is a channel filter 10 for discriminating against anything other than the appropriate carrier frequency and a suitable amplifier 12; at the other end of the standard system is a modulation detector 14 conventionally used to detect a modulated wave and to provide an output signal which is then transmitted to a relay driver 16 to provide suitable amplification and to drive a relay 18 which is a fail-safe, or vital, relay, as is well-known in this art.

The components which form the shunt enhancement logic circuit of the present invention are interposed between the already described blocks representing the amplifier 12 and the modulation detector 14. The blocks representing the novel arrangement are shown within the dotted lines, such shunt enhancement logic circuit being designated 20.

Figure 2:
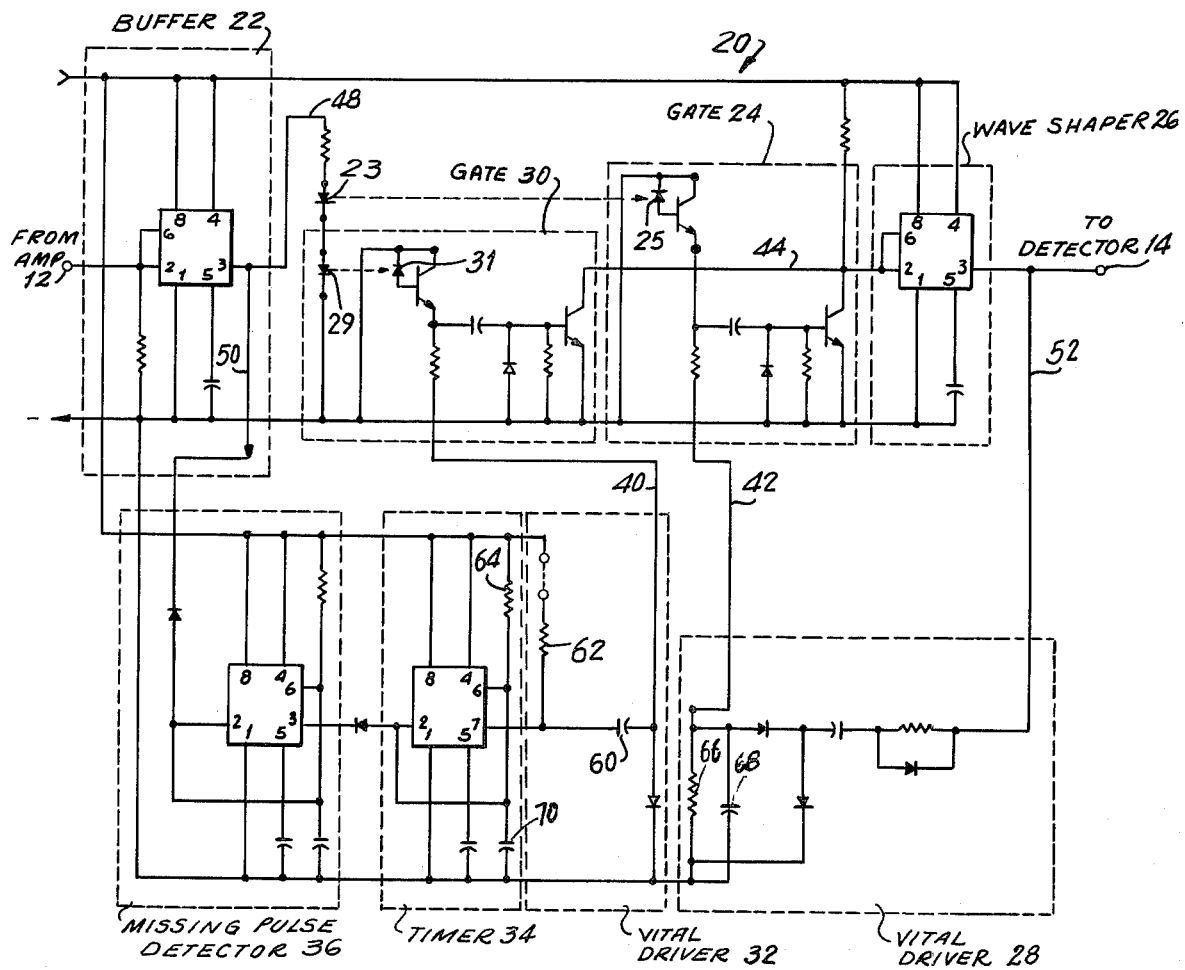
FIG. 2 is a schematic diagram of the detailed circuitry involved in the shunt enhancement logic means of the present invention.

Referring to FIG. 2, the schematic diagram illustrates in some detail all of the components of the shunt enhancement logic circuit, each of the individual components being shown within the dotted line boxes seen therein, and each bearing numerals that correspond with those seen in FIG. 1. Thus it will be appreciated that the numeral 22 designates a buffer device in both figures; 24 and 30 are so-called Dyna-level gates; 26 is a wave shaper; 28 a vital driver, as is 32; 34 is a timer and 36 is a missing pulse detector.

It will be seen in FIG. 2 that certain of the components, that is buffer 22, wave shaper 26, timer 34 and missing pulse detector 36, each includes what is known in the art as a 555 timer which is an integrated circuit unit sold by a number of leading manufacturers. For example, one of these is manufactured by Motorola Company, their identification being MC1555; reference may be made to one of Motorola Company's current brochures for specifications and applications information on this unit MC1555. It suffices to say that the terminals identified as 1 through 8 can be variously employed for different functions; that is, the same essential integrated circuitry can be utilized for different purposes by selective connection of the terminals available on such units. The circuitry of the 555 timer is incorporated herein by reference.

In the operation of the system in which the shunt enhancement logic circuit of the present invention is incorporated, a track signal from receiver-amplifier 12 is transmitted through a buffer 22. This track signal is a modulated carrier signal, the carrier frequency being of the order of 1700 Hz. From buffer 22, the modulated carrier signal goes to a first, Dyna-level gate 24 by way of the output connection 48. The specific manner of transmission is by means of a light-emitting diode 23 (FIG. 2) whose output is coupled to a light sensitive diode 25. Similarly, another gate, i.e., Dyna-level gate 30, receives the output signal from output 48 by the coupling of light-emitting diode 29 to light sensitive diode 31. The outputs of the first and second gate are commoned together by output connection 44 which is taken to the input of wave shaper 26, the output of which is connected to the modulation detector 14, and also by way of line 52 to vital driver 28. The output of vital driver 28 is connected by feedback line 42 to another input of the first Dyna-level gate 24. This feedback arrangement effects latching of the Dyna-level, or fail-safe AND, gate but in a restricted manner as will be explained.

An additional connection is made from the output of buffer 22, that is, from output 48 by way of line 50 to missing pulse detector 36, the output of which is connected to timer 34, the output of that device, in turn, being connected to vital driver 32. The output of driver 32 is connected by line 40 to another input of the second Dyna-level gate, that is, gate 30. This gate, as will be appreciated, is not a latching gate but rather simply a momentary gate.

The essential operation of the shunt enhancement logic circuit of the present invention is as follows:

The track signal from the receiver-amplifier 12 passes through gate 24, resulting in an AC output which is passed through wave shaper 26 and is then fed back through vital driver 28 to produce a DC input over line 42. Thus, the DC input to the gate 24 is derived from the AC output from the gate 24. The time constant of the filter 66, 68 on the DC input is short, with the result that any short duration interruption of signal causes the gate 24 to become unlatched, thereby to ensure release of relay 18.

This, of course, occurs during the short intervals when a shunting contact is being made across the tracks, such that the shunt, being of lower ohmic characteristic, causes interruption of the normal transmission of the carrier signal. This intermittent short duration interruption is precisely what the shunt enhancement logic of the present invention is designed to detect. Were it not for this logic circuit or element, the vital or B-relay would not release under short duration shunting. What the present invention accomplishes is to detect any short duration interruption of signal and simulate the occurrence of a much longer term shunting, and to do so safely.

The above will be appreciated from the fact that once a short duration interruption has occurred, the latch circuit of gate 24 cannot be latched again without the action of second Dyna-level gate 30. This second gate is enabled by pulses of "super minus" value caused by the completion of a timing cycle; as a result, gate 24 will be reset if it is concurrently receiving a signal from the track circuit.

Accordingly, missing pulse detector 36 detects any interruption of signal from buffer 22, and continuously responsive to such interruptions, triggers timer 34. The output of timer 34 is connected to driver 32 and consequently a signal is produced on line 40 to the input of gate 30. As a result, timer 34 is effective to determine the length of time that the short term shunting is enhanced.

The complete circuit of the shunt enhancement logic feature may be considered fail-safe because the Dyna-level latch circuit defined by the gate 24 is vital in that it must release when the signal is interrupted and cannot restore itself. It will be noted that if the timer 34 fails to operate, the output signal path connected to wave shaper 26 is never restored. This is because the aforesaid required pulse of super minus voltage will only occur if the timer cycle has been completed.

It will therefore be understood that if the timer 34 runs too long or forever, this is a safe condition inasmuch as gate 30 will then not be enabled and, hence, gate 24 will not be reset or relatched. On the other hand, if the timer runs for too short a time, capacitor 60 which functions to trigger or enable the reset gate 30, will not charge fully through the resistor 62, which has a value of approximately 680 kilohms.

Both of the resistors, that is, resistor 62 and another resistor 64, which are associated with timer 34, are selected to be film resistors. The reason for this is that such resistors will not fail in a way which would cause a dangerous condition to arise; that is to say, any failure causes such a resistor to increase in value only and not to decrease.

It should further be noted that the discharge resistor, that is, resistor 66 on the vital driver 28, is a four-terminal, vital type resistor because it is necessary to ensure that charge is removed from capacitor 68 during a short interval of shunting. The timer 34 is safely recyclable because the timing cycle already described is initiated by discharging the timing capacitor 70. This recycle feature means that each momentary train shunt that occurs acts to extend the timing cycle.

As previously indicated, the duration of shunt that can be detected is determined by carrier frequency and filter band width. This short interval cannot be less than one cycle of carrier. A conventional receiver, having a carrier frequency of 1740 Hz. requires a shunt of about 20 milliseconds because of filter band width. The shunt, of course, may be extended as long as desired, being limited only by the acceptable delay in restoring the track relay after a train has left the circuit. Thus, the predetermined delay period previously suggested is 2.5 seconds which is a tolerable length of time to change from, for example, a closed gate condition at an intersection to an open gate allowing traffic on a highway or the like to proceed across the tracks.

If desired, an extra precautionary arrangement can be adopted, by which resistor 62, which is connected to the terminal 7 of the timer 34, is not in circuit unless the back contact 72 of the vital relay 18 is in its closed position. This closed position for the back contact will not occur unless the relay has released. Thus, resetting of the timer through resistor 62 cannot occur until the relay has released so as to complete the circuit in which the back contact is disposed.

While there has been shown and described what is considered at present to be the preferred embodiment of the present invention, it will be appreciated by those skilled in the art that modifications of such embodiment may be made. It is therefore desired that the invention not be limited to this embodiment, and it is intended to cover in the appended claims all such modifications as fall within the true spirit and scope of the invention.

What is claimed is:

1. In a signaling system for use in connection with railroad tracks for ensuring fail-safe performance in the operation of a control device, such system including a carrier frequency receiver comprising a channel filter, a modulation detector, and a vital relay which releases only upon the occurrence of shunting of predetermined extended duration, the improvement comprising means for detecting interruption of said carrier frequency due to occurrences of comparatively short-duration shunting, and means for so extending or enhancing their time period that said occurrences of short-duration shunting ensure release of said vital relay.

2. A system as defined in claim 1, in which said means for detecting short-duration shunting effects includes first and second gates, said gates having a common output and each having at least two inputs, one input of each being connected in common; a separate input to a first of said gates, means for converting an AC signal at the output of said first gate into a DC signal for application to said separate input whereby said first gate remains latched only so long as said AC signal is continuously received; further including a filter on the DC input whose time constant is such that a short duration interruption of signal causes the first gate to unlatch, thereby to ensure release of the vital relay.

3. A circuit or system as defined in claim 2, in which said second gate has a separate input, and means connected to that separate input for resetting or relatching said first gate responsive to the passing of a predetermined time period.

4. A circuit or system as defined in claim 3, in which a means, connected to said second gate, is provided for detecting the occurrence of short duration shunting effect on said tracks and for extending or enhancing said short duration shunt.

5. A circuit or system as defined in claim 4, in which said short duration is approximately 15 milliseconds.

6. A circuit or system as defined in claim 4, in which said means includes a missing pulse detector; a timer, responsive to the output of said missing pulse detector, for initiating a timing cycle whenever a missing pulse is detected, said missing pulse corresponding to the aforementioned short duration shunting effect.

7. A circuit or system as defined in claim 6, further comprising a driver connected to the separate input of said second gate, a buffer device the output of which is connected in common to respective inputs of said first and second gates and to the input of said missing pulse detector.

8. A circuit or system as defined in claim 7, further comprising a pair of resistors connected to respective outputs of said timer, said pair of resistors being film resistors which when they fail can only increase in resistance.

9. A circuit or system as defined in claim 8, in which said vital or track relay is provided with a back contact connected in series with one of said pair of resistors whereby said vital relay must release before said resistor can be connected so as to allow for reset of said timer.

* * * * *